(12) United States Patent
Tani et al.

(10) Patent No.: US 8,476,915 B2
(45) Date of Patent: Jul. 2, 2013

(54) APPARATUS AND METHOD FOR DETERMINING THE TYPE OF ELECTROMAGNETIC WAVE GENERATING SOURCE

(75) Inventors: Hiroyuki Tani, Hyogo (JP); Shoichi Kajiwara, Osaka (JP)

(73) Assignee: Panasonic Corporation, Osaka (JP)

( * ) Notice: Subject to any disclaimer, the term of this patent is extended or adjusted under 35 U.S.C. 154(b) by 489 days.

(21) Appl. No.: 12/771,642

(22) Filed: Apr. 30, 2010

(65) Prior Publication Data

US 2010/0277157 A1   Nov. 4, 2010

(30) Foreign Application Priority Data

Apr. 30, 2009  (JP) .................................. 2009-111360

(51) Int. Cl.
*G01R 31/308* (2006.01)

(52) U.S. Cl.
USPC ............ 324/750.12; 324/754.29; 324/754.27; 324/357

(58) Field of Classification Search
USPC .......... 324/750.12, 250, 175, 754.31, 750.26, 324/750.27, 359, 344, 332, 329, 326, 300, 324/301; 257/48
See application file for complete search history.

(56) References Cited

U.S. PATENT DOCUMENTS

| 6,300,779 B1 | 10/2001 | Tamaki et al. |
| 7,358,749 B2 * | 4/2008 | Kazama et al. ........... 324/754.27 |
| 7,710,131 B1 * | 5/2010 | Tiernan ..................... 324/754.29 |
| 2007/0024293 A1 * | 2/2007 | Kosaka et al. ................ 324/750 |

FOREIGN PATENT DOCUMENTS

| JP | 2000-74969 | 3/2000 |
| JP | 2002-277550 | 9/2002 |

* cited by examiner

*Primary Examiner* — Arleen M Vazquez
*Assistant Examiner* — Son Le
(74) *Attorney, Agent, or Firm* — Hamre, Schumann, Mueller & Larson, P.C.

(57) ABSTRACT

An apparatus for determining a type of an electromagnetic wave generating source, including: a measurement unit that measures electromagnetic field strength at first and second measurement points at vertically different respective distances from a main surface of an object to be measured; a calculation unit that calculates an attenuation amount of the electromagnetic field strength between the first and second measurement points using measured values of the electromagnetic field strength measured by the measurement unit; and a determination unit that determines whether the generating source is the electric current source or the magnetic current source by judging which one of a reference value of an electric current source and a reference value of a magnetic current source is close to a value of the attenuation amount calculated by the calculation unit.

8 Claims, 7 Drawing Sheets

FIG. 5

|  | $r1 < \lambda/2\pi, r2 < \lambda/2\pi$ | | $r1 < \lambda/2\pi, r2 > \lambda/2\pi$ | |
|---|---|---|---|---|
|  | ELECTRIC CURRENT SOURCE | MAGNETIC CURRENT SOURCE | ELECTRIC CURRENT SOURCE | MAGNETIC CURRENT SOURCE |
| $E(P2) / E(P1)$ | $\left(\dfrac{r1}{r2}\right)^3$ | $\left(\dfrac{r1}{r2}\right)^2$ | $\dfrac{k_0^2 r1^3}{r2}$ | $\dfrac{k_0 r1^2}{r2}$ |
| $H(P2) / H(P1)$ | $\left(\dfrac{r1}{r2}\right)^2$ | $\left(\dfrac{r1}{r2}\right)^3$ | $\dfrac{k_0 r1^2}{r2}$ | $\dfrac{k_0^2 r1^3}{r2}$ |

APPARATUS AND METHOD FOR DETERMINING THE TYPE OF ELECTROMAGNETIC WAVE GENERATING SOURCE

BACKGROUND OF THE INVENTION

1. Field of the Invention

The present invention relates to an apparatus and a method for determining the type of an electromagnetic wave generating source for determining the type of a generating source of an electromagnetic wave emitted from electronic equipment.

2. Description of the Related Art

In recent years, to minimize EMI (Electromagnetic Interference) due to radiation emitted from electronic equipment, many countries establish controls over permissible values of electromagnetic waves emitted from electronic equipment. For example, in overseas countries, agencies such as FCC (Federal Communications Commission), CISPR (Comité international spécial des perturbations radioélectriques (International Special Committee on Radio Interference)), and VDE (Verband Deutscher Elektrotechniker (Association of German Electrical Engineers)) set standards. In Japan, VCCI (Voluntary Control Council for Information Technology Equipment) sets voluntary control standards, and electronic equipment manufacturers try to reduce EMI radiation emitted from electronic equipment.

For such standards, methods for measuring EMI radiation include a method for measuring electric field strength in a position a predetermined distance (for example, 3 or 10 m) apart from electronic equipment that is a generating source of EMI radiation. This method is generally referred to as "far field measurement". A standard value of this method is referred to as a "far field measurement standard value". The method uses special measurement environment or measurement devices, and requires considerable expertise in measurement. Also, because of the far field measurement, it is difficult to identify the generating source of an electromagnetic wave in the electronic equipment. Thus, EMI radiation measures require enormous amount of time and costs. Thus, recently, to reduce time and costs, a measurement device is used near, for example, a printed circuit board of electronic equipment that emits an electromagnetic wave to measure electromagnetic field strength. Further, to reduce time and costs, a demand is increasing for a method for estimating a far field measurement standard value using a measurement result of a measurement device.

Such a measurement device includes, for example, a device that scans a near field of an object to be measured, measures a near electromagnetic field distribution of the object to be measured, and outputs a measurement result as an electromagnetic field distribution image (for example, see Japanese Patent Laid-Open No. 2000-74969). The device can be used to identify a large area of a near electromagnetic field of the object to be measured based on the electromagnetic field distribution image, and evaluate the electromagnetic field emitted from the object to be measured. Also, a method for estimating a far field measurement standard value from a near electromagnetic field of an object to be measured includes a method for calculating an electric current value of an electromagnetic wave generating source based on a near electromagnetic field of an object to be measured, and estimating a far field measurement standard value (for example, see Japanese Patent Laid-Open No. 2002-277550).

However, when the electromagnetic wave generating source is not an electric current source but a magnetic current source, this method cannot estimate a far field measurement standard value with high accuracy. Also, this method takes measures for current distribution, and it cannot be determined whether an area against which the measures are taken radiates noise as an electric current source or as a magnetic current source. Thus, unfortunately, the electromagnetic wave generating source cannot be correctly determined, and effective measures cannot be taken against EMI radiation.

SUMMARY OF THE INVENTION

The present invention has an object to provide an apparatus and a method for determining the type of an electromagnetic wave generating source that can estimate a far field measurement standard value with high accuracy, and further can precisely determine whether the electromagnetic wave generating source is an electric current source or a magnetic current source based on a measurement result of a near electromagnetic field of an object to be measured, and achieve efficient EMI radiation measures.

To achieve the above-described object, an apparatus for determining the type of an electromagnetic wave generating source according to the present invention has features described below.

An apparatus for determining a type of an electromagnetic wave generating source according to the present invention, including: a measurement unit that measures electromagnetic field strength at first and second measurement points at vertically different respective distances from a main surface of an object to be measured; a calculation unit that calculates an attenuation amount of the electromagnetic field strength between the first and second measurement points using measured values of the electromagnetic field strength measured by the measurement unit; and a determination unit that determines whether the generating source is the electric current source or the magnetic current source by judging which one of a reference value of an electric current source and a reference value of a magnetic current source is close to a value of the attenuation amount calculated by the calculation unit.

The apparatus for determining a type of an electromagnetic wave generating source may further include an estimation unit that identifies an electric current value using the measured values and estimates electric field strength at any point using the electric current value when the determination unit determines that the generating source is the electric current source, while identifies a magnetic current value using the measured values and estimates electromagnetic field strength at any point using the magnetic current value when the generating source is the magnetic current source.

The present invention may be embodied as the apparatus for determining the type of an electromagnetic wave generating source, and also as a method for determining the type of an electromagnetic wave generating source described below.

A method for determining a type of an electromagnetic wave generating source according to the present invention, including the steps of: measuring electromagnetic field strength at first and second measurement points at vertically different respective distances from a main surface of an object to be measured; calculating an attenuation amount of the electromagnetic field strength between the first and second measurement points using measured values of the electromagnetic field strength measured in the measurement step; and determining whether the generating source is the electric current source or the magnetic current source by judging which one of a reference value of an electric current source and a reference value of a magnetic current source is close to a value of the attenuation amount calculated in the calculation step.

The method for determining a type of an electromagnetic wave generating source may further include the steps of identifying an electric current value using the measured values and estimating electric field strength at any point using the electric current value when the determination step determines that the generating source is the electric current source, while identifying a magnetic current value using the measured values and estimating electromagnetic field strength at any point using the magnetic current value when the generating source is the magnetic current source.

The present invention can determine whether each generating source of an electromagnetic wave of an object to be measured is an electric current source or a magnetic current source, and estimate a far field measurement standard value with high accuracy based on a determination result.

The present invention can be used for measuring EMI radiation emitted from electronic equipment.

BRIEF DESCRIPTION OF THE DRAWINGS

FIG. 5 shows a relationship between attenuation amounts of electric field strength and magnetic field strength and the electromagnetic wave generating source;

DESCRIPTION OF THE PREFERRED EMBODIMENTS (Embodiment 1)

Now, Embodiment 1 of the present invention will be described with reference to the drawings.

Figure 1:
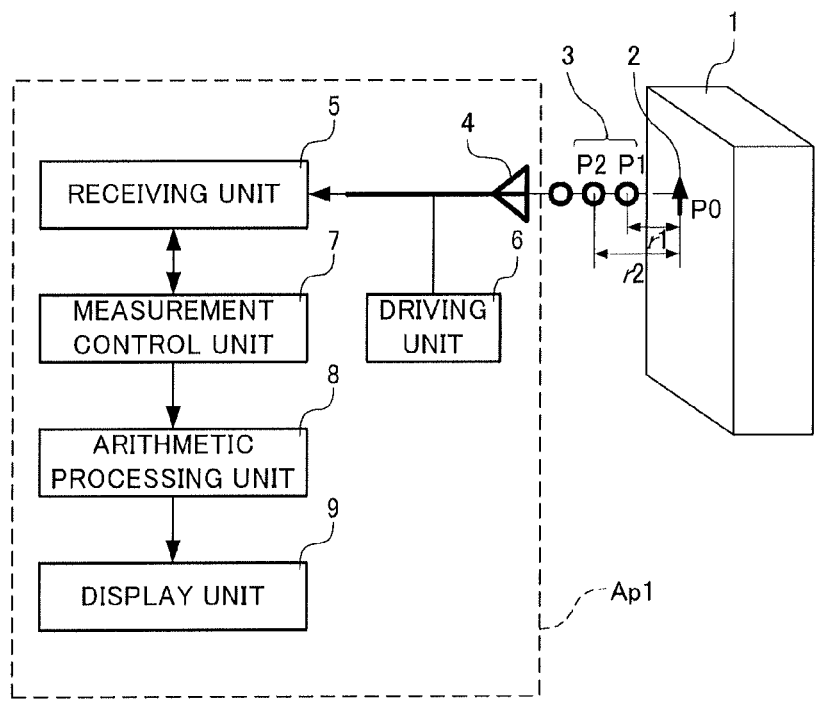
FIG. 1 shows a configuration of an apparatus for determining the type of an electromagnetic wave generating source according to Embodiment 1 of the present invention.

As shown in FIG. 1, an apparatus Ap1 for determining the type of an electromagnetic wave generating source measures electromagnetic field strength while moving a receiving antenna 4 as an electromagnetic field sensor from an object 1 to be measured having an electromagnetic wave generating source. The apparatus Ap1 includes the receiving antenna 4, a receiving unit 5, a driving unit 6, a measurement control unit 7, an arithmetic processing unit 8, and a display unit 9 by way of example. The apparatus Ap1 measures electromagnetic field strength at measurement points P1 and P2 on the same line at different respective distances from an electromagnetic wave generation point P0 of the object 1.

The receiving antenna 4 receives an electromagnetic wave emitted from an object to be measured. The receiving unit 5 executes a receiving process at a broadband measuring object frequency for the electromagnetic wave received by the receiving antenna 4. The driving unit 6 moves the receiving antenna 4 in XYZ coordinate axis directions. The measurement control unit 7 executes data processing of the electromagnetic wave executed by the receiving unit 5, and stores a result from the data processing in a storage device (not shown) as a measurement result. The arithmetic processing unit 8 determines whether the electromagnetic wave generating source is an electric current source or a magnetic current source based on the measurement result stored in the storage device (not shown) by the measurement control unit 7, and estimates a far field measurement standard value. The display unit 9 displays a result determined by the arithmetic processing unit 8 and the far field measurement standard value estimated by the arithmetic processing unit 8.

Specifically, a measurement function of the apparatus Ap1 is performed by the receiving antenna 4, the receiving unit 5, the driving unit 6, and the measurement control unit 7. The measurement function measures the electromagnetic field strength at the measurement points P1 and P2 at vertically different respective distances from a main surface of the object 1. A calculation function of the apparatus Ap1 is performed by the arithmetic processing unit 8. The calculation function calculates an attenuation amount of the electromagnetic field strength between the measurement points P1 and P2 using measured values of the electromagnetic field strength measured by the measurement function. A determination function of the apparatus Ap1 is performed by the arithmetic processing unit 8. The determination function determines whether the generating source is the electric current source or the magnetic current source by judging which one of a reference value of the electric current source and a reference value of the magnetic current source is close to the value of the attenuation amount calculated by the calculation function. The reference value of the electric current source is the attenuation amount when the generating source is the electric current source. The reference value of the magnetic current source is the attenuation amount when the generating source is the magnetic current source. An estimation function of the apparatus Ap1 is performed by the arithmetic processing unit 8. The estimation function identifies an electric current value using the measured values and estimates electric field strength at any point using the electric current value when the determination function determines that the generating source is the electric current source. While the estimation function identifies a magnetic current value using the measured values and estimates magnetic field strength at any point using the magnetic current value when the determination function determines that the generating source is the magnetic current source.

As the receiving antenna 4, a loop antenna, a dipole antenna, or the like may be applied, but not limited to these antennas.

Specifically, the apparatus Ap1 measures the electromagnetic field strength at the measurement points P1 and P2 while moving the receiving antenna 4 substantially vertically to the main surface of the object 1. The measurement point P1 is a position a distance r1 apart from the point P0 of the object 1. The measurement point P2 is a position a distance r2 (r1<r2) apart from the point P0 of the object 1.

The apparatus Ap1 calculates an attenuation amount of electromagnetic field strength based on the electromagnetic field strength at the measurement points P1 and P2. At this time, the arithmetic processing unit 8 calculates an attenuation amount of electromagnetic field strength due to an increased distance based on electromagnetic field strength at a plurality of measurement points at different respective distances from the object 1. Further, the arithmetic processing unit 8 determines whether the electromagnetic wave generating source is the electric current source or the magnetic current source based on the calculated attenuation amount, and estimates an electric field value of a far field measurement standard value.

Next, electromagnetic fields generated by the electric current source and the magnetic current source will be described.

Figures 2A, 2B:
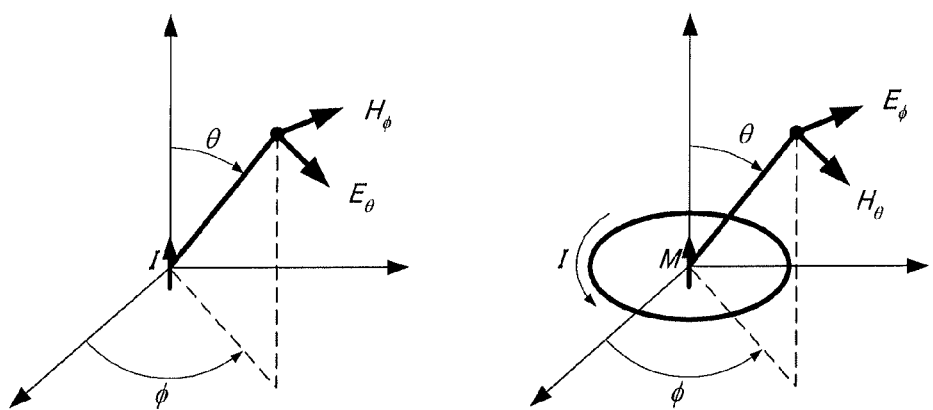
FIG. 2A shows an outline of an electromagnetic field generated by an infinitesimal dipole antenna.
FIG. 2B shows an outline of an electromagnetic field generated by an infinitesimal loop antenna.

As shown in FIG. 2A, the electric current source is expressed by Expressions (1) and (2) below as radiation from an infinitesimal dipole antenna. As shown in FIG. 2B, the magnetic current source is expressed by Expressions (3) and (4) below as radiation from an infinitesimal loop antenna.

[Expression 1]

$$E_\theta = Z_0 \frac{IL}{4\pi} k_0^2 \left\{ j\frac{1}{k_0 r} + \frac{1}{(k_0 r)^2} - j\frac{1}{(k_0 r)^3} \right\} e^{-jk_0 r} \sin\theta \quad (1)$$

[Expression 2]

$$H_\phi = \frac{IL}{4\pi} k_0^2 \left\{ j\frac{1}{k_0 r} + \frac{1}{(k_0 r)^2} \right\} e^{-jk_0 r} \sin\theta \quad (2)$$

[Expression 3]

$$E_\phi = -jZ_0 \frac{k_0^3 m}{4\pi} \left\{ j\frac{1}{k_0 r} + \frac{1}{(k_0 r)^2} \right\} e^{-jk_0 r} \sin\theta \quad (3)$$

[Expression 4]

$$H_\theta = j\frac{k_0^3 m}{4\pi} \left\{ j\frac{1}{k_0 r} + \frac{1}{(k_0 r)^2} - j\frac{1}{(k_0 r)^3} \right\} e^{-jk_0 r} \sin\theta \quad (4)$$

Herein, I is an electric current value of the infinitesimal dipole antenna. L is a length of the infinitesimal dipole antenna. m is a magnetic current value of the infinitesimal loop antenna. r is a distance from the infinitesimal dipole antenna or the infinitesimal loop antenna. $Z_0$ is a wave impedance, which is $120\pi$. $k_0$ is a wave number, which is $2\pi/\lambda$ ($\lambda$ is a wavelength for a measuring object frequency f). The receiving antenna 4 is moved substantially vertically ($\theta=\pi/2$) to the main surface of the object 1, and thus an electric field $E_r$ and a magnetic field $H_r$ are 0, which are omitted.

Figure 3:
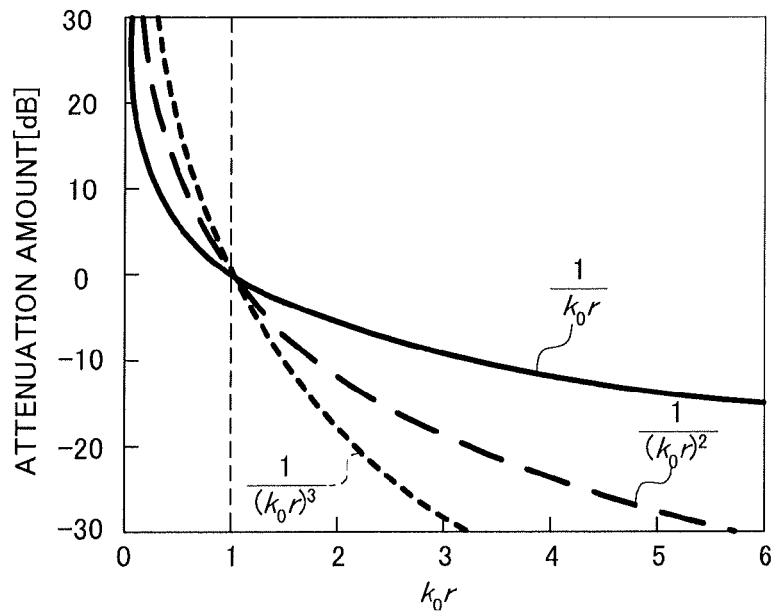
FIG. 3 shows an attenuation characteristic of an electric field generated by the infinitesimal dipole antenna.

An electric field generated by the electric current source is expressed as the sum of three components proportional to $1/r$, $1/r^2$ and $1/r^3$ as expressed in Expression (1). A magnetic field generated by the electric current source is expressed as the sum of two components proportional to $1/r$ and $1/r^2$ as expressed in Expression (2). Meanwhile, an electric field generated by the magnetic current source is expressed as the sum of two components proportional to $1/r$ and $1/r^2$ as expressed in Expression (3). A magnetic field generated by the magnetic current source is expressed as the sum of three components proportional to $1/r$, $1/r^2$ and $1/r^3$ as expressed in Expression (4). These expressions show that an attenuation tendency of the electromagnetic field changes at $k_0 \cdot r = 1$, that is, $r = \lambda/2\pi$ as shown in FIG. 3.

For example, the electric field generated by the electric current source is largely influenced by $1/r^3$ in a near field ($r<\lambda/2\pi$) of the object to be measured. The electric field generated by the magnetic current source is largely influenced by $1/r^2$ in the near field ($r<\lambda/2\pi$) of the object to be measured. Thus, in the near field ($r<\lambda/2\pi$) of the object to be measured, the electric field is more easily attenuated by the electric current source than by the magnetic current source.

The magnetic field generated by the electric current source is largely influenced by $1/r^2$ in the near field ($r<\lambda/2\pi$) of the object to be measured. The magnetic field generated by the magnetic current source is largely influenced by $1/r^3$ in the near field ($r<\lambda/2\pi$) of the object to be measured. Thus, in the near field ($r<\lambda/2\pi$) of the object to be measured, the magnetic field is more easily attenuated by the magnetic current source than by the electric current source.

Both the electromagnetic field generated by the electric current source and the electromagnetic field generated by the magnetic current source are largely influenced by $1/r$ in a position sufficiently apart from the object to be measured, that is, a far field ($r>\lambda/2\pi$) of the object to be measured.

Thus, in the near field ($r<\lambda/2\pi$) of the object to be measured, it can be determined from the attenuation amount of the electromagnetic field whether the electromagnetic wave generating source is the electric current source or the magnetic current source. In the far field ($r>\lambda/2\pi$) of the object to be measured, it cannot be determined whether the electromagnetic wave generating source is the electric current source or the magnetic current source. Thus, to determine whether the electromagnetic wave generating source is the electric current source or the magnetic current source, at least one of the plurality of measurement points needs to be located in the near field ($r<\lambda/2\pi$) of the object to be measured.

The near field refers to a range of the distance r from the electromagnetic wave generating source. The far field refers to a farther range than the distance r. The distance r is a value obtained by dividing the wavelength $\lambda$ for the measuring object frequency f by $2\pi$. Specifically, the near field and the far field differ depending on the measuring object frequency f (wavelength $\lambda$). For example, when the measuring object frequency f is 30 MHz, the wavelength $\lambda$ is 10 m, and thus a near field ($r<\lambda/2\pi=1.59$ m) refers to a range of 1.59 m from the electromagnetic wave generating source. When the measuring object frequency f is 300 MHz, the wavelength $\lambda$ is 1 m, and a near field ($r<\lambda/2\pi=0.159$ m) refers to a range of 0.159 m from the electromagnetic wave generating source. When the measuring object frequency f is 1 GHz, the wavelength $\lambda$ is 0.3 m, and thus a near field ($r<\lambda/2\pi=0.047$ m) refers to a range of 0.047 m from the electromagnetic wave generating source.

Next, a method for determining whether the electromagnetic wave generating source is the electric current source or the magnetic current source will be described in detail.

Figure 4:
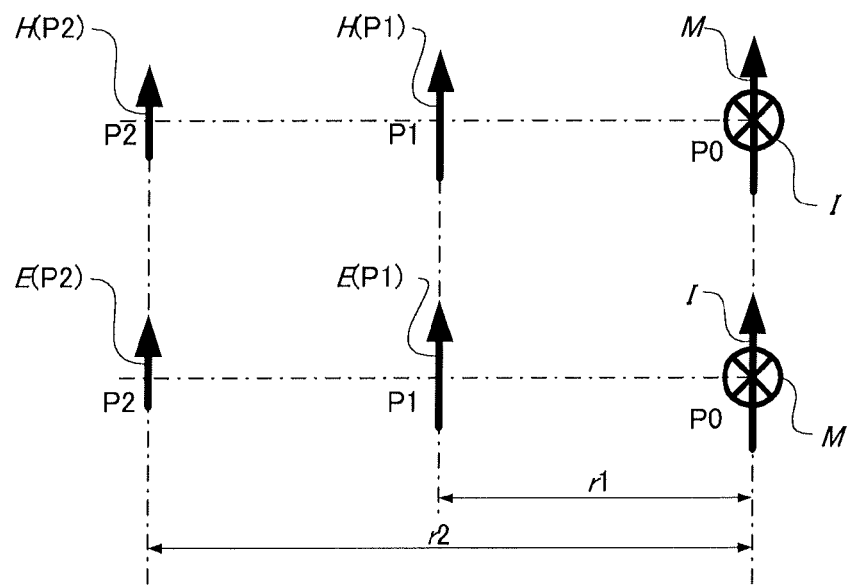
FIG. 4 shows an outline of a method for determining an electromagnetic wave generating source based on an attenuation amount of electromagnetic field strength.
Figure 6:
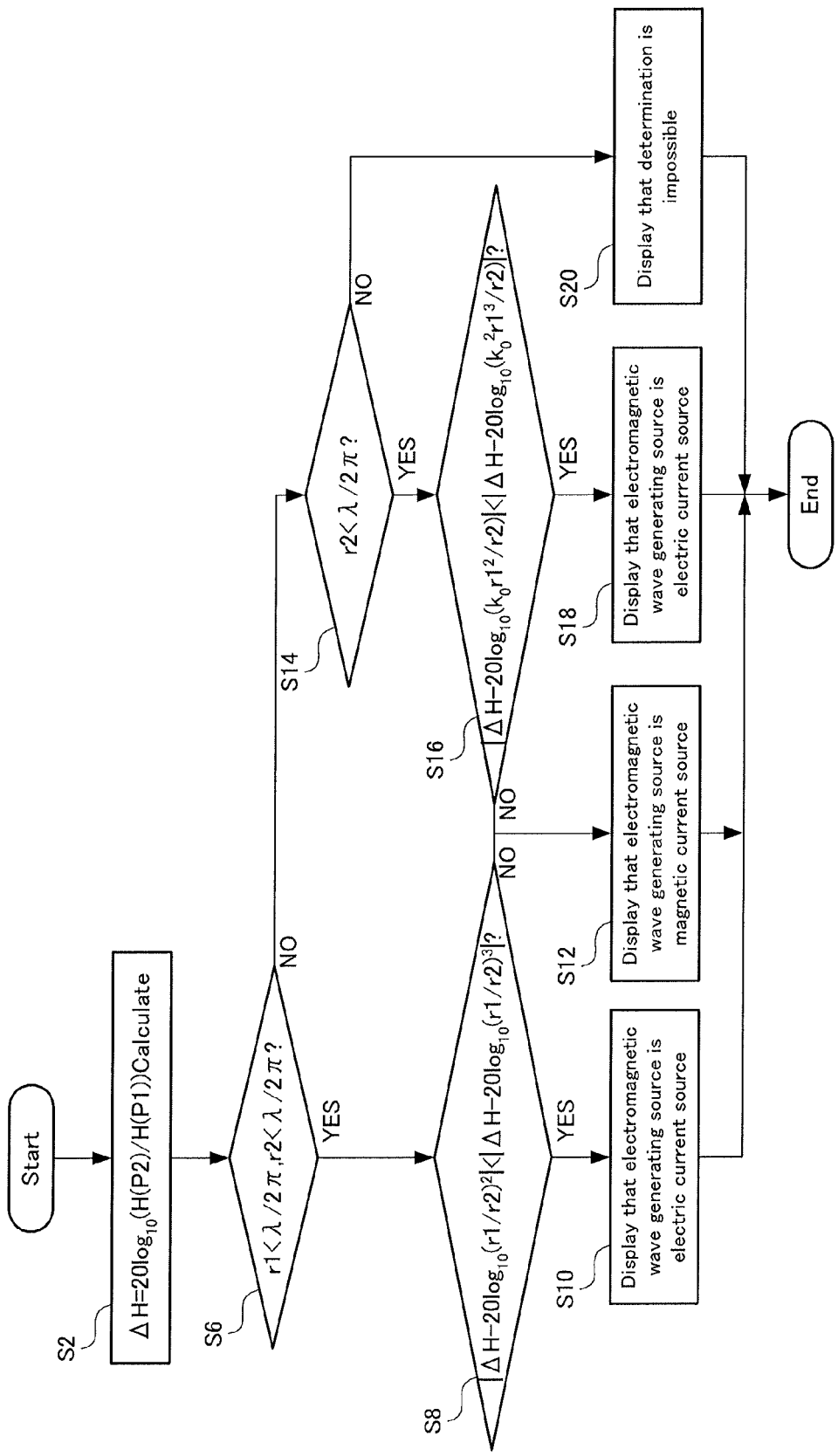
FIG. 6 shows an operation of the apparatus for determining the type of an electromagnetic wave generating source according to Embodiment 1 of the present invention.

As shown in FIG. 4, the apparatus Ap1 measures, at the measurement points P1 and P2, an electromagnetic wave generated from the point P0. At this time, the apparatus Ap1 measures, at the measurement point P1, electric field strength E(P1) of an electromagnetic wave attenuated while propagating the distance r1. The apparatus Ap1 measures, at the measurement point P2, electric field strength E(P2) of the electromagnetic wave further attenuated. The apparatus Ap1 further calculates an attenuation amount $\Delta E=20\log_{10}(E(P2)/E(P1))$ of the electric field strength at the measurement points P1 and P2 from the electric field strength E(P1) and the electric field strength E(P2). Then, the apparatus Ap1 determines whether the electromagnetic wave generating source at the point P0 is the electric current source or the magnetic current source based on the attenuation amount $\Delta E$ of the electric field strength at the measurement points P1 and P2.

Alternatively, the apparatus Ap1 measures, at the measurement point P1, magnetic field strength H(P1) of the electromagnetic wave attenuated while propagating the distance r1. The apparatus Ap1 measures, at the measurement point P2, magnetic field strength H(P2) of the electromagnetic wave further attenuated. The apparatus Ap1 further calculates an attenuation amount $\Delta H = 20 \log_{10}(H(P2)/H(P1))$ of the magnetic field strength at the measurement points P1 and P2 from the magnetic field strength H(P1) and the magnetic field strength H(P2). Then, the apparatus Ap1 determines whether the electromagnetic wave generating source at the point P0 is the electric current source or the magnetic current source based on the attenuation amount $\Delta H$ of the magnetic field strength at the measurement points P1 and P2.

Herein, $r1 < \lambda/2\pi$ and $r2 < \lambda/2\pi$ are satisfied. In this case, when the electromagnetic wave generating source at the point P0 is the electric current source, the attenuation amount $\Delta E$ of the electric field strength can be approximated as expressed in Expression (5) below. When the electromagnetic wave generating source at the point P0 is the magnetic current source, the attenuation amount $\Delta E$ of the electric field strength can be approximated as expressed in Expression (6) below. Specifically, as expressed in Expression (7), when the attenuation amount $\Delta E$ of the electric field strength is closer to an approximate value by Expression (5) than an approximate value by Expression (6), it can be determined that the electromagnetic wave generating source at the point P0 is the electric current source. On the other hand, when the attenuation amount $\Delta E$ of the electric field strength is closer to the approximate value by Expression (6) than the approximate value by Expression (5), it can be determined that the electromagnetic wave generating source at the point P0 is the magnetic current source.

[Expression 5]
$$\frac{E(P2)}{E(P1)} \cong \left(\frac{r1}{r2}\right)^3 \quad (5)$$

[Expression 6]
$$\frac{E(P2)}{E(P1)} \cong \left(\frac{r1}{r2}\right)^2 \quad (6)$$

[Expression 7]
$$\left|\Delta E - 20 \log_{10}\left(\frac{r_1}{r_2}\right)^3\right| < \left|\Delta E - 20 \log_{10}\left(\frac{r_1}{r_2}\right)^2\right| \quad (7)$$

When the electromagnetic wave generating source at the point P0 is the electric current source, the attenuation amount $\Delta H$ of the magnetic field strength can be approximated as expressed in Expression (8) below. When the electromagnetic wave generating source at the point P0 is the magnetic current source, the attenuation amount $\Delta H$ of the magnetic field strength can be approximated as expressed in Expression (9) below. Specifically, as expressed in Expression (10), when the attenuation amount $\Delta H$ of the magnetic field strength is closer to an approximate value by Expression (8) than an approximate value by Expression (9), it can be determined that the electromagnetic wave generating source at the point P0 is the electric current source. On the other hand, when the attenuation amount $\Delta H$ of the magnetic field strength is closer to the approximate value by Expression (9) than the approximate value by Expression (8), it can be determined that the electromagnetic wave generating source at the point P0 is the magnetic current source.

[Expression 8]
$$\frac{H(P2)}{H(P1)} \cong \left(\frac{r1}{r2}\right)^2 \quad (8)$$

[Expression 9]
$$\frac{H(P2)}{H(P1)} \cong \left(\frac{r1}{r2}\right)^3 \quad (9)$$

[Expression 10]
$$\left|\Delta H - 20 \log_{10}\left(\frac{r_1}{r_2}\right)^2\right| < \left|\Delta H - 20 \log_{10}\left(\frac{r_1}{r_2}\right)^3\right| \quad (10)$$

Herein, $r1 < \lambda/2\pi$ and $r2 > \lambda/2\pi$ are satisfied. In this case, when the electromagnetic wave generating source at the point P0 is the electric current source, the attenuation amount $\Delta E$ of the electric field strength can be approximated as expressed in Expression (11) below. When the electromagnetic wave generating source at the point P0 is the magnetic current source, the attenuation amount $\Delta E$ of the electric field strength can be approximated as expressed in Expression (12) below. Specifically, as expressed in Expression (13), when the attenuation amount $\Delta E$ of the electric field strength is closer to an approximate value by Expression (11) than an approximate value by Expression (12), it can be determined that the electromagnetic wave generating source at the point P0 is the electric current source. On the other hand, when the attenuation amount $\Delta E$ of the electric field strength is closer to the approximate value by Expression (12) than the approximate value by Expression (11), it can be determined that the electromagnetic wave generating source at the point P0 is the magnetic current source.

[Expression 11]
$$\frac{E(P2)}{E(P1)} \cong \frac{k_0^2 r1^3}{r2} \quad (11)$$

[Expression 12]
$$\frac{E(P2)}{E(P1)} \cong \frac{k_0 r1^2}{r2} \quad (12)$$

[Expression 13]
$$\left|\Delta E - 20 \log_{10}\left(\frac{k_0^2 r1^3}{r2}\right)\right| < \left|\Delta E - 20 \log_{10}\left(\frac{k_0 r1^2}{r2}\right)\right| \quad (13)$$

When the electromagnetic wave generating source at the point P0 is the electric current source, the attenuation amount $\Delta H$ of the magnetic field strength can be approximated as expressed in Expression (14) below. When the electromagnetic wave generating source at the point P0 is the magnetic current source, the attenuation amount $\Delta H$ of the magnetic field strength can be approximated as expressed in Expression (15) below. Specifically, as expressed in Expression (16), when the attenuation amount $\Delta H$ of the magnetic field strength is closer to an approximate value by Expression (14) than an approximate value by Expression (15), it can be determined that the electromagnetic wave generating source at the point P0 is the electric current source. On the other hand, when the attenuation amount $\Delta H$ of the magnetic field strength is closer to the approximate value by Expression (15) than the approximate value by Expression (14), it can be determined that the electromagnetic wave generating source at the point P0 is the magnetic current source.

[Expression 14]
$$\frac{H(P2)}{H(P1)} \cong \frac{k_0 r1^2}{r2} \quad (14)$$

[Expression 15]
$$\frac{H(P2)}{H(P1)} \cong \frac{k_0^2 r1^3}{r2} \quad (15)$$

[Expression 16]
$$\left| \Delta H - 20 \log_{10}\left(\frac{k_0 r1^2}{r2}\right) \right| < \left| \Delta H - 20 \log_{10}\left(\frac{k_0^2 r1^3}{r2}\right) \right| \quad (16)$$

For example, it is supposed that the magnetic field is measured at r1=0.03 m and r2=0.09 m. In this case, when the measuring object frequency is 300 MHz, $\lambda/2\pi$=0.159 m. This satisfies r1<$\lambda/2\pi$ and r2<$\lambda/2\pi$. Thus, it can be determined whether the electromagnetic wave generating source is the electric current source or the magnetic current source by judging which of the approximate values by Expressions (8) and (9) is close to the attenuation amount $\Delta H$ of the magnetic field strength. From actual calculation, the approximate value by Expression (8) is 19.08 dB. The approximate value by Expression (9) is 28.63 dB. When the electromagnetic wave generating source is the electric current source, a calculated value of the attenuation amount $\Delta H$ of the magnetic field strength by Expression (2) is 18.03 dB. When the electromagnetic wave generating source is the magnetic current source, a calculated value of the attenuation amount $\Delta H$ of the magnetic field strength by Expression (4) is 29.54 dB. In both of the cases, the approximate value is close to the calculated value. This shows that the approximate values by Expressions (8) and (9) are effective as reference values of the attenuation amount $\Delta H$ of the magnetic field strength to determine whether the electromagnetic wave generating source is the electric current source or the magnetic current source.

Also, it is supposed that the magnetic field is measured at r1=0.03 m and r2=0.09 m. In this case, when the measuring object frequency is 1 GHz, $\lambda/2\pi$=0.0477 m. This satisfies r1<$\lambda/2\pi$, r2>$\lambda/2\pi$. Thus, it can be determined whether the electromagnetic wave generating source is the electric current source or the magnetic current source by judging which of the approximate values by Expressions (14) and (15) is close to the attenuation amount $\Delta H$ of the magnetic field strength. From actual calculation, the approximate value by Expression (14) is 13.58 dB. The approximate value by Expression (15) is 17.61 dB. When the electromagnetic wave generating source is the electric current source, a calculated value of the attenuation amount $\Delta H$ of the magnetic field strength by Expression (2) is 13.95 dB. When the electromagnetic wave generating source is the magnetic current source, a calculated value of the attenuation amount $\Delta H$ of the magnetic field strength by Expression (4) is 17.41 dB. In both of the cases, the approximate value is close to the calculated value. This shows that the approximate values by Expressions (14) and (15) are effective as reference values of the attenuation amount $\Delta H$ of the magnetic field strength to determine whether the electromagnetic wave generating source is the electric current source or the magnetic current source.

Specifically, the apparatus Ap1 measures electric field strength at the plurality of measurement points including a near field of the object to be measured (r<$\lambda/2\pi$). Further, the apparatus Ap1 calculates the attenuation amount ($\Delta E$) from the electric field strength measured at the plurality of measurement points. Then, the apparatus Ap1 judges which of the approximate values of the attenuation amounts of the electromagnetic wave emitted from the electric current source and the magnetic current source is close to the calculated attenuation amount ($\Delta E$). This allows the determination whether the electromagnetic wave generating source is the electric current source or the magnetic current source.

Alternatively, the apparatus Ap1 measures magnetic field strength at the plurality of measurement points including a near field of the object to be measured (r<$\lambda/2\pi$). Further, the apparatus Ap1 calculates the attenuation amount ($\Delta H$) from the magnetic field strength measured at the plurality of measurement points. Then, the apparatus Ap1 judges which of the approximate values of the attenuation amounts of the electromagnetic wave emitted from the electric current source and the magnetic current source is close to the calculated attenuation amount ($\Delta H$). This allows the determination whether the electromagnetic wave generating source is the electric current source or the magnetic current source.

FIG. 5 shows a correspondence between the attenuation amount $\Delta E$ of the electric field strength and the attenuation amount $\Delta H$ of the magnetic field strength and the electromagnetic wave generating source.

Directions of the electric current source and the magnetic current source may be determined based on directions of the electric field and the magnetic field.

Next, an operation of the apparatus Ap1 will be described. Herein, a case where the magnetic field strength is used to determine the electromagnetic wave generating source will be described.

Figure 7:
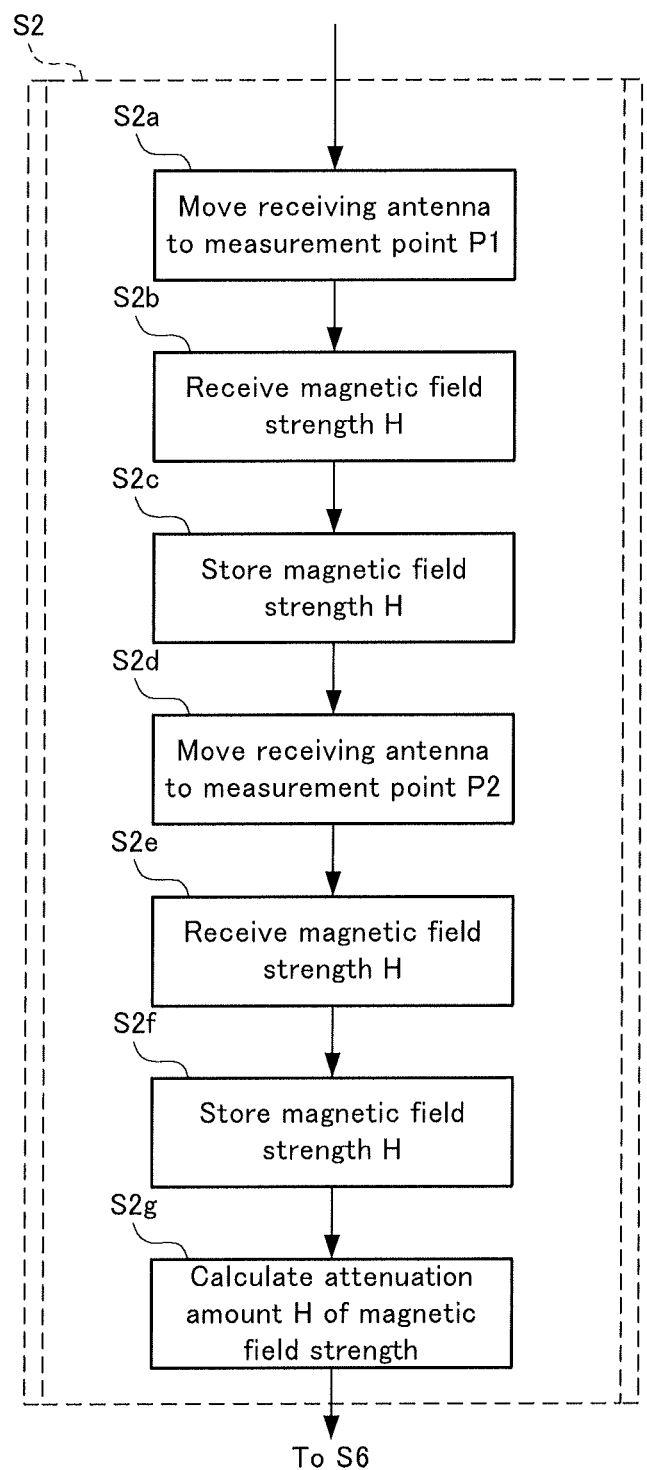
FIG. 7 shows details of an electromagnetic field strength attenuation amount calculation step in the operation of the apparatus for determining the type of an electromagnetic wave generating source according to Embodiment 1 of the present invention.

First, the apparatus Ap1 calculates the attenuation amount $\Delta H$ of the magnetic field strength based on the magnetic field strength H(P1) at the measurement point P1 and the magnetic field strength H(P2) at the measurement point P2 (Step S2). A detailed description in this step will be described later with reference to FIG. 7.

Then, the apparatus Ap1 judges whether r1<$\lambda/2\pi$ and r2<$\lambda/2\pi$ are satisfied (Step S6). When it is judged that r1<$\lambda/2\pi$ and r2<$\lambda/2\pi$ are satisfied (YES in Step S6), it is determined whether the electromagnetic wave generating source is the electric current source by judging which of the approximate values is close to the attenuation amount $\Delta H$ of the magnetic field strength based on Expression (10) (Step S8). When it is determined that the electromagnetic wave generating source is the electric current source (YES in Step S8), the fact that the point P0 is the electric current source is displayed on the display unit 9 (Step S10), and the process is finished. On the other hand, when the electromagnetic wave generating source is not the electric current source (NO in Step S8), the fact that the point P0 is the magnetic current source is displayed on the display unit 9 (Step S12), and the process is finished.

Meanwhile, the apparatus Ap1 judges whether r1<$\lambda/2\pi$ is satisfied when r1<$\lambda/2\pi$ and r2<$\lambda/2\pi$ are not satisfied (NO in Step S6) (Step S14). When it is judged that r1<$\lambda/2\pi$ is satisfied (YES in Step S14), it is determined whether the electromagnetic wave generating source is the electric current source by judging which of the approximate values is close to the attenuation amount $\Delta H$ of the magnetic field strength based on Expression (16) (Step S16). When it is determined that the electromagnetic wave generating source is the electric current source (YES in Step S16), the fact that the point P0 is the electric current source is displayed on the display unit 9 (Step S18), and the process is finished. On the other hand, when the electromagnetic wave generating source is not the electric current source (NO in Step S16), the fact that the point P0 is the magnetic current source is displayed on the display unit 9 (Step S12), and the process is finished.

When $r1<\lambda/2\pi$ is not satisfied (NO in Step S14), the fact that it cannot be determined whether the point P0 is the electric current source or the magnetic current source is displayed on the display unit 9 (Step S20), and the process is finished.

Next, a calculation operation of the attenuation amount ΔH of the magnetic field strength in Step S2 will be described in detail.

First, the apparatus Ap1 controls the driving unit 6 to move the receiving antenna 4 to the measurement point P1 (Step S2a). The receiving unit 5 receives the magnetic field strength H(P1) at the measurement point P1 (Step S2b). The measurement control unit 7 stores the magnetic field strength H(P1) at the measurement point P1 (Step S2c). The above-described processes are also performed for the measurement point P2 (Step S2d) to (Step S2f). Then, the attenuation amount ΔH of the magnetic field strength is calculated based on the magnetic field strengths H(P1) and H(P2) (Step S2g).

The attenuation amount ΔE of the electric field strength may be similarly calculated. The attenuation amount ΔE of the electric field strength may be calculated instead of the attenuation amount ΔH of the magnetic field strength.
(Embodiment 2)

Now, Embodiment 2 of the present invention will be described with reference to the drawings. The same components as in Embodiment 1 are denoted by the same reference numerals, and descriptions thereof will be omitted.

Figure 8:
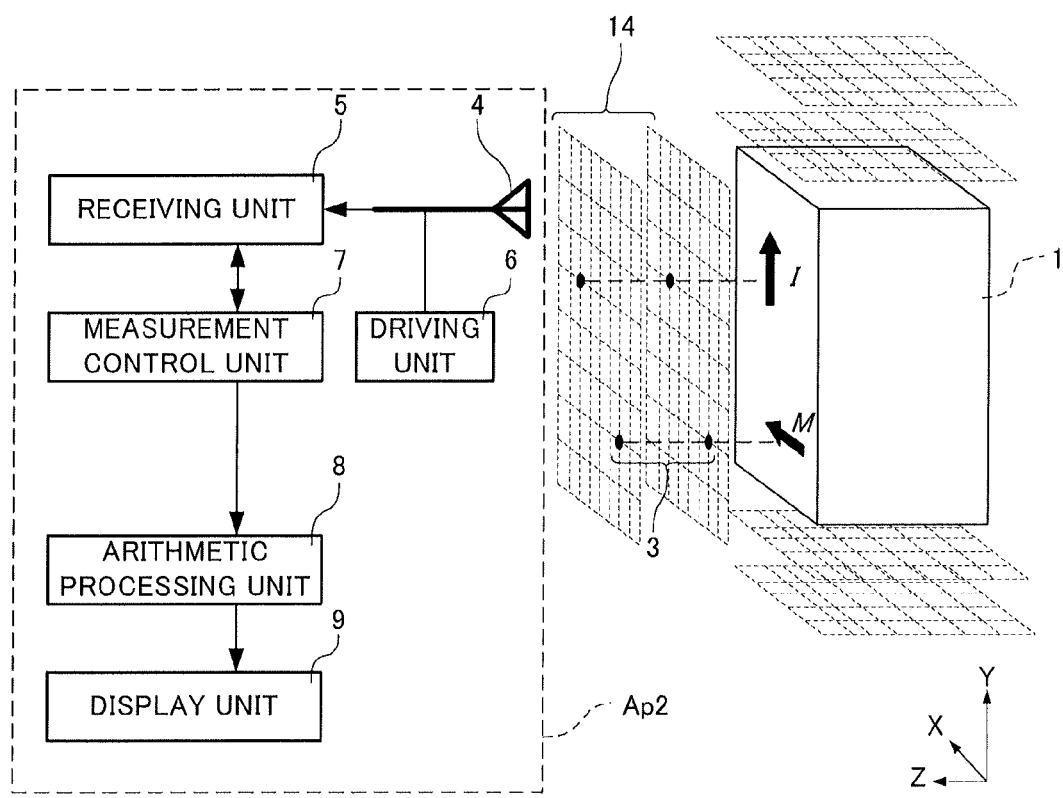
FIG. 8 shows a method for determining the type of an electromagnetic wave generating source using an apparatus for determining the type of an electromagnetic wave generating source according to Embodiment 2 of the present invention.

As shown in FIG. 8, an apparatus for determining the type of an electromagnetic wave generating source Ap2 is different from the apparatus Ap1 of Embodiment 1 in that electromagnetic field distribution in a plurality of measurement surfaces 14 is measured.

The plurality of measurement surfaces 14 are at least two planes substantially parallel to a main surface of an object 1 to be measured.

Specifically, a receiving antenna 4 as an electromagnetic field sensor is moved a certain distance in a Z-axis direction from the object 1 to scan the measurement surface 14 in an X-axis direction and a Y-axis direction. Thus, the electromagnetic field distribution in the plurality of measurement surfaces 14 is measured.

As in Embodiment 1, an attenuation amount ΔE of electric field strength is calculated based on electric field strength in the plurality of measurement surfaces 14, it is determined whether an electromagnetic wave generating source is an electric current source or a magnetic current source based on the attenuation amount ΔE of the electric field strength, and a determination result is displayed. Alternatively, an attenuation amount ΔH of magnetic field strength is calculated based on magnetic field strength in the plurality of measurement surfaces 14, it is determined whether the electromagnetic wave generating source is the electric current source or the magnetic current source based on the attenuation amount ΔH of the magnetic field strength, and a determination result is displayed.

Further, when it is determined that the electromagnetic wave generating source is the electric current source, an electric current value I is calculated by measured values of an electric field and a magnetic field at each measurement point identified by electromagnetic field measurement distribution and Expressions (1) and (2). An electric field value and a magnetic field value at any far field measurement point are estimated by the calculated electric current value I and Expressions (1) and (2).

When it is determined that the electromagnetic wave generating source is the magnetic current source, a magnetic current value m is calculated by measured values of the electric field and the magnetic field at each measurement point identified by the electromagnetic field measurement distribution and Expressions (3) and (4). An electric field value and a magnetic field value at any far field measurement point are estimated by the calculated magnetic current value m and Expressions (3) and (4).

Next, an example of actual separation between the electric current source and the magnetic current source will be described.

Figure 9:
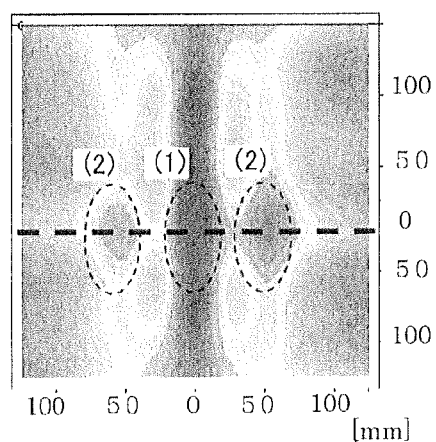
FIG. 9 shows near magnetic field strength of an object to be measured.
Figure 10:
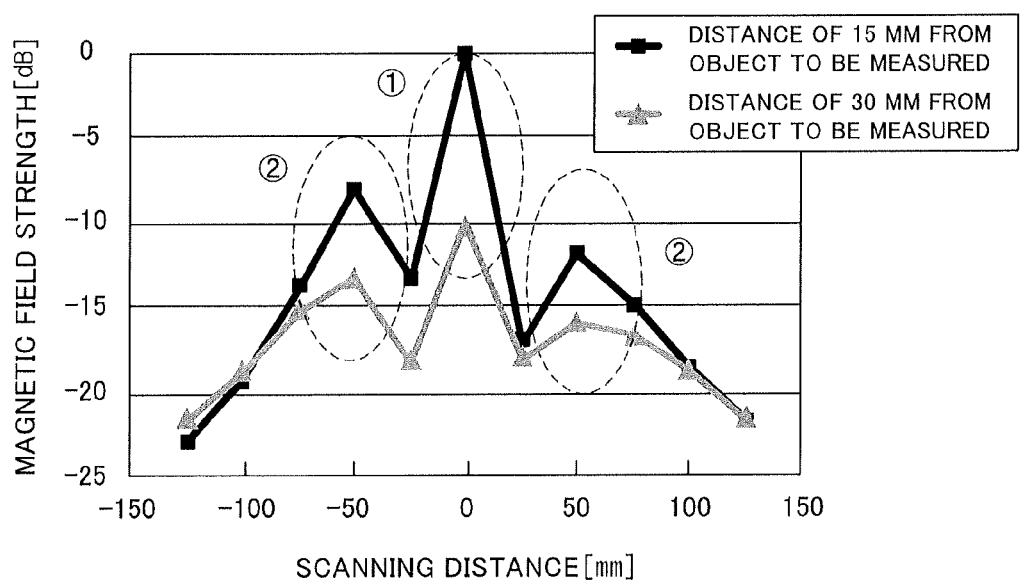
FIG. 10 shows distribution of magnetic field strength at a certain distance apart from the object to be measured.

Herein, near magnetic field distribution of the electromagnetic wave generating source was measured for a case where the receiving antenna 4 is moved a distance of 15 mm in the Z-axis direction from the object 1, and a case where the receiving antenna 4 is moved a distance of 30 mm in the Z-axis direction from the object 1. FIG. 9 shows the measured near magnetic field distribution. FIG. 10 shows magnetic field strength in positions shown by dotted lines in FIG. 9.

At this time, the distance from the object 1 is 15 to 30 mm, and is reduced by half. Thus, in the above-described determination method, when the electromagnetic wave generating source is the electric current source, $(1/2)^2=1/4$ to obtain a value of 6 dB as a received power ratio. Meanwhile, when the electromagnetic wave generating source is the magnetic current source, $(1/2)^3=1/8$ to obtain a value of 9 dB as the received power ratio.

From actual measured valued, as shown in FIG. 10, attenuation of 10 dB occurs in a middle region (1) of the near magnetic field distribution. Attenuation of 5 dB occurs in left and right regions (2) of the near magnetic field distribution. Thus, it can be determined that the magnetic current source is located in the middle region (1) of the object 1, and the electric current source is located in the left and right regions (2) of the object 1.

What is claimed is:

1. An apparatus for determining a type of an electromagnetic wave generating source, comprising:
    a measurement unit that measures electromagnetic field strength at first and second measurement points at vertically different respective distances from a main surface of an object to be measured;
    a calculation unit that calculates an attenuation amount of the electromagnetic field strength between the first and second measurement points using measured values of the electromagnetic field strength measured by the measurement unit; and
    a determination unit that determines whether the generating source is an electric current source or a magnetic source by judging which one of a reference value of the electric current source and a reference value of the magnetic source is close to a value of the attenuation amount calculated by the calculation unit.

2. The apparatus for determining a type of an electromagnetic wave generating source according to claim 1, further comprising an estimation unit that identifies an electric current value using the measured values and estimates electric field strength at any point using the electric current value when the determination unit determines that the generating source is the electric current source, while identifies a magnetic source current value using the measured values and estimates electromagnetic field strength at any point using the magnetic source current value when the generating source is the magnetic source.

3. The apparatus for determining a type of an electromagnetic wave generating source according to claim 1, wherein the measurement unit scans a first measurement surface parallel to the main surface of the object to be measured and including the first measurement point, and a second measurement surface parallel to the first measurement surface and including the second measurement point, and measures electromagnetic field distribution in each of the measurement surfaces.

4. The apparatus for determining a type of an electromagnetic wave generating source according to claim 1, wherein the measurement unit measures the electromagnetic field strength at the first measurement point located in a near field of the object to be measured and the second measurement point farther from the object to be measured than the first measurement point.

5. A method for determining a type of an electromagnetic wave generating source, comprising:
  measuring electromagnetic field strength at first and second measurement points at vertically different respective distances from a main surface of an object to be measured;
  calculating an attenuation amount of the electromagnetic field strength between the first and second measurement points using measured values of the electromagnetic field strength measured in the measurement step; and
  determining whether the generating source is an electric current source or a magnetic source by judging which one of a reference value of the electric current source and a reference value of the magnetic source is close to a value of the attenuation amount calculated in the calculation step.

6. The method for determining a type of an electromagnetic wave generating source according to claim 5, further comprising:
  identifying an electric current value using the measured values and estimating electric field strength at any point using the electric current value when the determination step determines that the generating source is the electric current source, while identifying a magnetic source current value using the measured values and estimating electromagnetic field strength at any point using the magnetic source current value when the generating source is the magnetic source.

7. The method for determining a type of an electromagnetic wave generating source according to claim 5, wherein the measurement step scans a first measurement surface parallel to the main surface of the object to be measured and including the first measurement point, and a second measurement surface parallel to the first measurement surface and including the second measurement point, and measures electromagnetic field distribution in each of the measurement surfaces.

8. The method for determining a type of an electromagnetic wave generating source according to claim 5, wherein the measurement step measures the electromagnetic field strength at the first measurement point located in a near field of the object to be measured and the second measurement point farther from the object to be measured than the first measurement point.

* * * * *